United States Patent
Yang et al.

(10) Patent No.: US 10,453,544 B2
(45) Date of Patent: Oct. 22, 2019

(54) MEMORY ARRAY WITH READ ONLY CELLS HAVING MULTIPLE STATES AND METHOD OF PROGRAMMING THEREOF

(71) Applicant: FREESCALE SEMICONDUCTOR, INC., Austin, TX (US)

(72) Inventors: Jianan Yang, Austin, TX (US); Brad J. Garni, Austin, TX (US); Shayan Zhang, Cedar Park, TX (US)

(73) Assignee: NXP USA, INC., Austin, TX (US)

( * ) Notice: Subject to any disclaimer, the term of this patent is extended or adjusted under 35 U.S.C. 154(b) by 342 days.

(21) Appl. No.: 14/565,875

(22) Filed: Dec. 10, 2014

(65) Prior Publication Data
US 2016/0172052 A1 Jun. 16, 2016

(51) Int. Cl.
*G11C 17/12* (2006.01)

(52) U.S. Cl.
CPC .................... *G11C 17/12* (2013.01)

(58) Field of Classification Search
CPC ..... G11C 17/12; G11C 17/123; G11C 17/126; G11C 17/14; G11C 17/00–18
See application file for complete search history.

(56) References Cited

U.S. PATENT DOCUMENTS

| | | | |
|---|---|---|---|
| 4,287,570 A | 9/1981 | Stark | |
| 5,289,406 A * | 2/1994 | Uramoto | G11C 11/56 365/104 |
| 5,394,355 A * | 2/1995 | Uramoto | G11C 11/56 365/103 |
| 5,771,208 A * | 6/1998 | Iwase | G11C 11/56 365/104 |
| 5,875,132 A | 2/1999 | Ozaki | |
| 6,002,607 A * | 12/1999 | Dvir | G11C 11/5692 365/103 |
| 6,215,728 B1 | 4/2001 | Yamada | |
| 6,556,468 B2 * | 4/2003 | Garg | G11C 17/16 365/104 |
| 6,826,070 B2 * | 11/2004 | Sung | G11C 17/12 257/E21.669 |
| 2011/0051487 A1 * | 3/2011 | Nevers | G11C 5/02 365/51 |
| 2011/0273919 A1 | 11/2011 | Buer et al. | |

* cited by examiner

*Primary Examiner* — Alfredo Bermudez Lozada (57) ABSTRACT

A read only memory (ROM) having a first row of ROM cells, a first conductive line along the first row of ROM cells, and a second conductive line along the first row of ROM cells. The ROM cells of the first row of ROM cells are selectively coupled during programming to the first conductive line and the second conductive line so that in a first mode of the ROM the first row of ROM cells provide a first combination of logic highs and logic lows and in a second mode of the memory the first row of ROM cells provide a second combination of logic highs and lows independent of the first combination of logic highs and logic lows.

17 Claims, 8 Drawing Sheets

| MODE | WL1 | WL2 | PRW1 | PRW2 | CELL1 | CELL2 | CELL3 | CELL4 | CELL5 | CELL6 | CELL7 | CELL8 |
|---|---|---|---|---|---|---|---|---|---|---|---|---|
| 1 | VDD | VDD | GND | VDD | LOW | LOW | LOW | LOW | HIGH | HIGH | HIGH | HIGH |
| 2 | VDD | GND | GND | GND | LOW | LOW | LOW | HIGH | LOW | LOW | HIGH | HIGH |
| 3 | VDD | VDD | VDD | VDD | LOW | HIGH | LOW | HIGH | LOW | HIGH | LOW | HIGH |

VDD ≙ HIGH VOLTAGE
GND ≙ LOW VOLTAGE

MEMORY ARRAY WITH READ ONLY CELLS HAVING MULTIPLE STATES AND METHOD OF PROGRAMMING THEREOF

FIELD OF THE INVENTION

The present invention relates generally to memory cells, arrays, and architectures. In particular, the present invention relates to read only memory cells, arrays and architectures thereof.

BACKGROUND ART

Today, various products and applications (e.g., Bluetooth products, WLAN products, mobile baseband and multimedia processors, etc.) require significant amounts of on-chip read-only memory (ROM). Conventional ROM cells, cell arrays, and memory architectures suffer from a number of problems, including area inefficiency, high cost, and high power consumption due to high leakage, for example.

There is a need therefore for improved ROM cells, ROM cell arrays, and memory architectures.

SUMMARY

The present invention provides a read only memory device with read only memory cells having multiple states and a method of programming thereof as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. Generally, the drawing in which an element first appears is typically indicated by the leftmost digit(s) in the corresponding reference number.

DETAILED DESCRIPTION OF EMBODIMENTS

Figure 1:
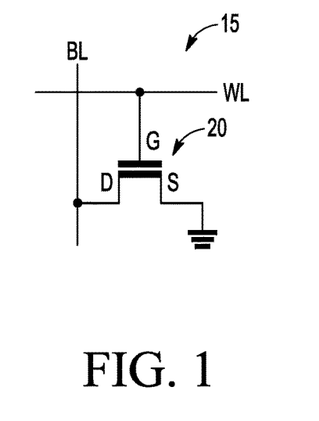
FIG. 1 schematically illustrates a conventional ROM bitcell, which allows for a single logic state or bit to be stored therein.

FIG. 1 schematically illustrates a conventional ROM bitcell 15. As shown in FIG. 1, bitcell 15 includes a MOS (Metal Oxide Semiconductor) transistor 20. Typically, the source terminal of MOS transistor 20 is coupled to ground, and the drain terminal of MOS transistor 20 pre-charged to a predetermined voltage value. The gate terminal of MOS transistor 20 is coupled to a word line WL and the drain terminal of MOS transistor 20 is selectively connected (either coupled or not) to a bit line BL depending on whether a logic high or a logic low is programmed in the bitcell.

In standby mode (i.e., when bitcell 15 is not being read), a low voltage (e.g., ground) may be applied on word line WL. When bitcell 15 is being read, the voltage on word line WL is raised (or in other words, word line WL is activated) and MOS transistor 20 will turn ON. Consequently, the voltage on bit line BL would either pull down to ground if the drain terminal of MOS transistor 20 is coupled to bit line BL or remain at its initial value, thereby reflecting the logic value stored in the bitcell. For example, the voltage on bit line BL would fall to a low value when a logic "0" is stored in bitcell 15, and remain high when a logic "1" is stored in bitcell 15. (Alternatively, the voltage on bit line BL would fall to a low value when a logic "1" is stored in bitcell 15, and remain high when a logic "0" is stored in bitcell 15.) Generally, a sensing structure (e.g., inverter circuit) is used to sense the voltage on bit line BL, and output the logic value corresponding to the voltage.

As described above, conventional bitcell 15 allows for a single logic state or bit to be stored therein. As a result, when large amounts of ROM are needed, conventional bitcell array solutions tend to be large in area and thus high in cost. Embodiments of the present invention, as further described below, provide improved ROM bitcell structures, bitcell arrays, and ROM architectures having increased data storage capabilities, smaller area, lower cost, and significantly reduced power consumption/loss.

FIGS. 2 to 5 schematically illustrate an example memory array with a read only memory cell 10 according to one embodiment of the present invention. The memory cell 10 is capable of storing/representing two logic states (or two bits to be stored in the memory cell 10), which are independent from each other. Each logic state is in turn either logic high (logic "0") or logic low (logic "1"). For simplification purposes, only one row and one column of an example memory array with one memory cell 10 are shown in FIGS. 2 to 5. However, as would be understood by a person of skill in the art based on the teachings herein, example memory array may include any number of rows/columns, depending on the use requirements of the array.

Each memory cell 10 comprises a transistor 20, in particular a MOS (metal oxide semiconductor) transistor and more particularly a MOSFET (metal oxide semiconductor field effect transistor). The memory cell 10 of FIGS. 2 to 5 is coupled to the bit line BL i and is coupled selectively to one of two word lines WL 1 and WL 2 of each Row j. The word lines WL 1 and WL 2 of each Row j are provided by the memory array. As will be understood more completely below, the word lines WL 1 and WL 2 should not be understood as independent from each other but allow for operating the memory cell 10 in two different ROM modes. The memory cell 10 allows for a single logic state or bit to be stored therein in each of the two different ROM modes.

Figure 2:
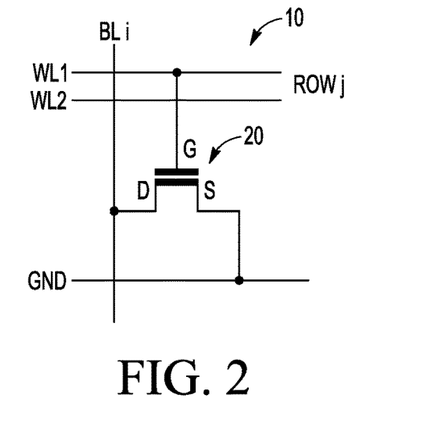
FIG. 2 schematically illustrates a circuit diagram of an example memory array with one 2-bit read only memory cells, i.e. two logic states or bits stored therein, according to one embodiment of the present invention.

The memory cell 10 of FIG. 2 is coupled to the first word line WL 1 of the Row j. More particularly, the gate terminal of the MOS transistor 20 is coupled to the first word line WL 1, the drain terminal of the MOS transistor 20 is coupled to the bit line BL i, and the source terminal of the MOS transistor 20 is coupled to ground.

In order to read out the memory cell 10 of FIG. 2 in the first ROM mode, the voltage of the word lines WL 1 and WL 2 of the Row j is raised (the word lines WL 1 and WL 2 of the Row j are activated) and a pre-charging voltage is applied to the bit line BL i. In accordance with the wiring of the MOS transistor 20 of the memory cell 10, the MOS transistor 20 will turn ON and the voltage on the bit line BL i will pull down to ground. For example, a low voltage on the bit line BL i represents a logic "0" (logic low) stored in memory cell 10.

In order to read out the memory cell 10 of FIG. 2 in the second ROM mode, the voltage of the first word line WL 1 of the Row j is raised but a low voltage is applied to the second word line WL 2 of the Row j (e.g. the second word line WL 2 is coupled to ground) and a pre-charging voltage is applied to the bit line BL i. In accordance with the wiring of the MOS transistor 20 of the memory cell 10, the MOS transistor 20 will turn ON (since the gate terminal of the MOS transistor 20 is coupled to the first word line WL 1 of the Row j) and the voltage on the bit line BL i will pull down to ground.

Hence, the bit line BL i is pulled down to ground in both ROM modes.

Figure 3:
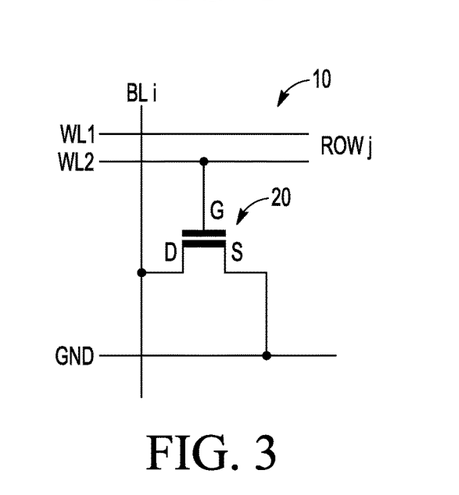
FIG. 3 schematically illustrates a circuit diagram of an example memory array with one 2-bit read only memory cells according to one embodiment of the present invention.

The memory cell 10 of FIG. 3 is coupled to the second word line WL 2 of the Row j. More particularly, the gate terminal of the MOS transistor 20 is coupled to the second word line WL 2, the drain terminal of the MOS transistor 20 is coupled to the bit line BL i, and the source terminal of the MOS transistor 20 is coupled to ground.

In order to read out the memory cell 10 of FIG. 3 in the first ROM mode, the voltage of the word lines WL 1 and WL 2 of the Row j is raised (the word lines WL 1 and WL 2 of the Row j are activated) and a pre-charging voltage is applied to the bit line BL i. In accordance with the wiring of the MOS transistor of the memory cell 10, the MOS transistor 20 will turn ON and the voltage on the bit line BL i will pull down to ground. For example, a low voltage on the bit line BL i represents a logic "0" (logic low) stored in memory cell 10.

In order to read out the memory cell 10 of FIG. 3 in the second ROM mode, the voltage of the first word line WL 1 of the Row j is raised but a low voltage is applied to the second word line WL 2 of the Row j (e.g. the second word line WL 2 is coupled to ground) and a pre-charging voltage is applied to the bit line BL i. In accordance with the wiring of the MOS transistor 20 of the memory cell 10, the MOS transistor 20 will turn OFF (since the gate terminal of the MOS transistor 20 is coupled to the second word line WL 2 of the Row j) and the voltage on the bit line BL i will remain at its pre-charging level. For example, a high voltage on the bit line BL i represents a logic "1" (logic high) stored in memory cell 10.

Hence, the bit line BL i is pulled down to ground in the first ROM mode whereas the pre-charging voltage applied to the voltage bit line BL i remains at its pre-charging level in the second ROM mode.

Figure 4:
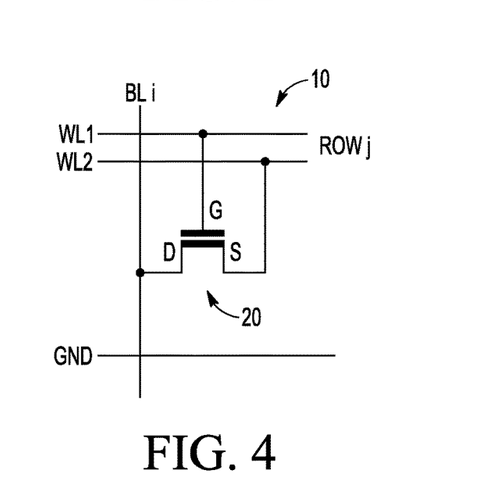
FIG. 4 schematically illustrates a circuit diagram of an example memory array with one 2-bit read only memory cells according to one embodiment of the present invention.

The memory cell 10 of FIG. 4 is coupled to the first word line WL 1 as well as the second word line WL 2 of the Row j. More particularly, the gate terminal of the MOS transistor 20 is coupled to the first word line WL 1, the drain terminal of the MOS transistor 20 is coupled to the bit line BL i, and the source terminal of the MOS transistor 20 is coupled to the second word line WL 2 of the Row j.

In order to read out the memory cell 10 of FIG. 4 in the first ROM mode, the voltage of the word lines WL 1 and WL 2 of the Row j is raised (the word lines WL 1 and WL 2 of the Row j are activated) and a pre-charging voltage is applied to the bit line BL i. In accordance with the wiring of the MOS transistor 20 of the memory cell 10, the MOS transistor 20 will turn ON but the voltage on the bit line BL i will remain at the pre-charging level since the source terminal is connected to the second word line WL 2, which is driven at a high voltage level, in particular at a high voltage level substantially equal to the pre-charging level. For example, a high voltage on the bit line BL i represents a logic "0" (logic low) stored in memory cell 10.

In order to read out the memory cell 10 of FIG. 4 in the second ROM mode, the voltage of the first word line WL 1 of the Row j is raised but a low voltage is applied to the second word line WL 2 of the Row j (e.g. the second word line WL 2 is coupled to ground) and a pre-charging voltage is applied to the bit line BL i. In accordance with the wiring of the MOS transistor 20 of the memory cell 10, the MOS transistor 20 will turn ON (since the gate terminal of the MOS transistor 20 is coupled to the first word line WL 1 of the Row j) but the voltage on the bit line BL i will pull down to the level of the low voltage applied to the first word line WL 1 of the Row (e.g. to will pull to ground). For example, a low voltage on the bit line BL i represents a logic "0" (logic low) stored in memory cell 10.

Hence, the pre-charging voltage applied to the bit line BL i remains at its pre-charging level in the first ROM mode whereas the bit line BL i is pulled down to ground in the second ROM mode.

Figure 5:
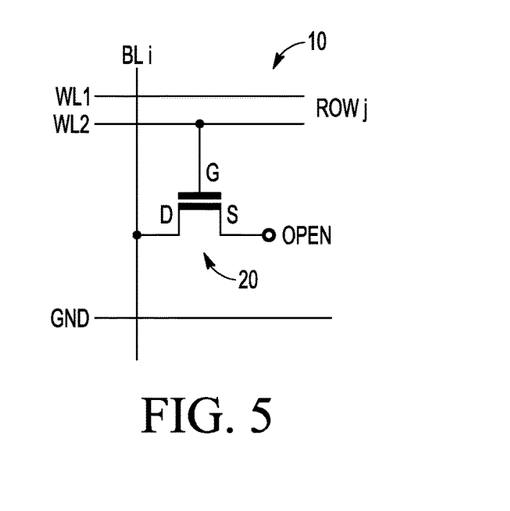
FIG. 5 schematically illustrates a circuit diagram of an example memory array with one 2-bit read only memory cells according to one embodiment of the present invention.

The memory cell 10 of FIG. 5 is coupled to the second word line WL 2 of the Row j. More particularly, the gate terminal of the MOS transistor 20 is coupled to the second word line WL 2, the drain terminal of the MOS transistor 20 is coupled to the bit line BL i, and the source terminal of the MOS transistor 20 is open. Alternatively, the source terminal of the MOS transistor 20 may be coupled to the first word line WL 1 of the Row j or to the second word line WL 2 of the Row j.

In order to read out the memory cell 10 of FIG. 5 in the first ROM mode, the voltage of the word lines WL 1 and WL 2 of the Row j is raised (the word lines WL 1 and WL 2 of the Row j are activated) and a pre-charging voltage is applied to the bit line BL i. In accordance with the wiring of the MOS transistor 20 of the memory cell 10, the MOS transistor 20 will turn ON but the voltage on the bit line BL i will remain at the pre-charging level since the source terminal is open (or alternatively connected to either the first word line WL 1 or second word line WL 2, to which a high voltage is applied). For example, a high voltage on the bit line BL i represents a logic "0" (logic low) stored in memory cell 10.

In order to read out the memory cell 10 of FIG. 5 in the second ROM mode, the voltage of the first word line WL 1 of the Row j is raised but a low voltage is applied to the second word line WL 2 of the Row j (e.g. the second word line WL 2 is coupled to ground) and a pre-charging voltage is applied to the bit line BL i. In accordance with the wiring of the MOS transistor 20 of the memory cell 10, the MOS transistor 20 will turn OFF (since the gate terminal of the MOS transistor 20 is coupled to the second word line WL 2 of the Row j) the voltage on the bit line BL i will remain at the pre-charging level (independently of whether the source terminal of the MOS transistor 20 is alternatively coupled to either the first word line WL 1 or the second word line WL2).

Hence, the pre-charging voltage applied to the bit line BL i remains at its pre-charging level in both ROM modes.

Figure 6:
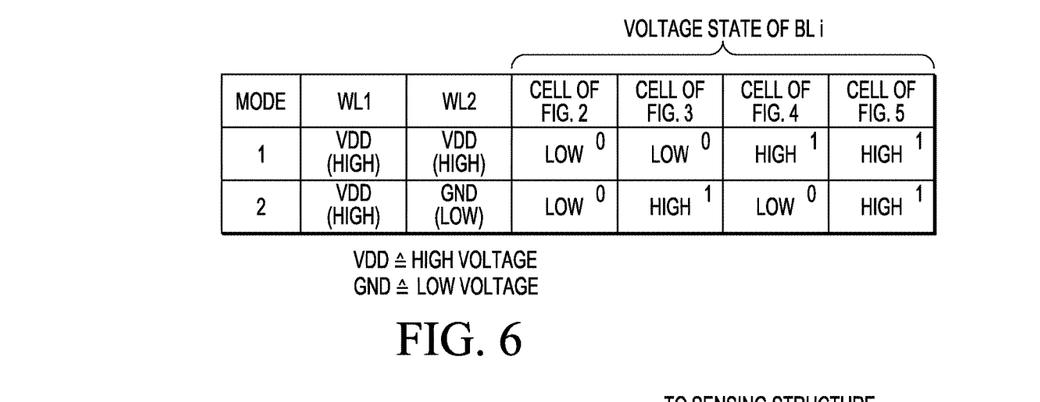
FIG. 6 shows a table of the voltage level of the (precharged) bit line BL i when reading out the 2-bit memory cells of FIGS. 2 to 5 in either one of the two ROM modes.

FIG. 6 summarizes the state of the bit line BL i when the memory cells 10 illustrated in FIGS. 2 to 5 are read out in either one of the first and second ROM modes. The different ROM modes are selected by either applying a high voltage to both the word lines WL 1 and WL 2 of the Row j or applying a high voltage to only the first word line WL 1 of the Row j whereas a low voltage is applied to the second word line WL 2 of the Row j (e.g. the second word line WL 2 is coupled to ground). The different wiring of the MOS transistor 20 of the memory cell 10 allows for implementing any of the four states corresponding to a 2-bit storage cell.

The separate and independent two states of the 2-bit storage cell 10 cannot be read out concurrently but subsequently in that the high voltage is applied selectively to the word lines WL 1 and WL 2 in accordance with the one of the ROM modes as summarized in the table of FIG. 6.

For example, a low voltage on the bit line BL i may represent a logic "0" (logic low) stored in memory cell 10 and a high voltage on the bit line BL i may represent a logic "1" (logic high) stored in memory cell 10. Hence, the storage cell 10 of FIG. 2 stores the 2-bit sequence "00", the storage cell 10 of FIG. 3 stores the 2-bit sequence "01", the storage cell 10 of FIG. 4 stores the 2-bit sequence "10", and the storage cell 10 of FIG. 5 stores the 2-bit sequence "11". From the above description, those skilled in the art understood that any of the four different two 2-bit values can be stored in the memory cell 10 in that a respective wiring of the gate terminal and the source terminal is arranged accordingly as illustrated exemplarily with reference to FIGS. 2 to 5.

Figure 7:
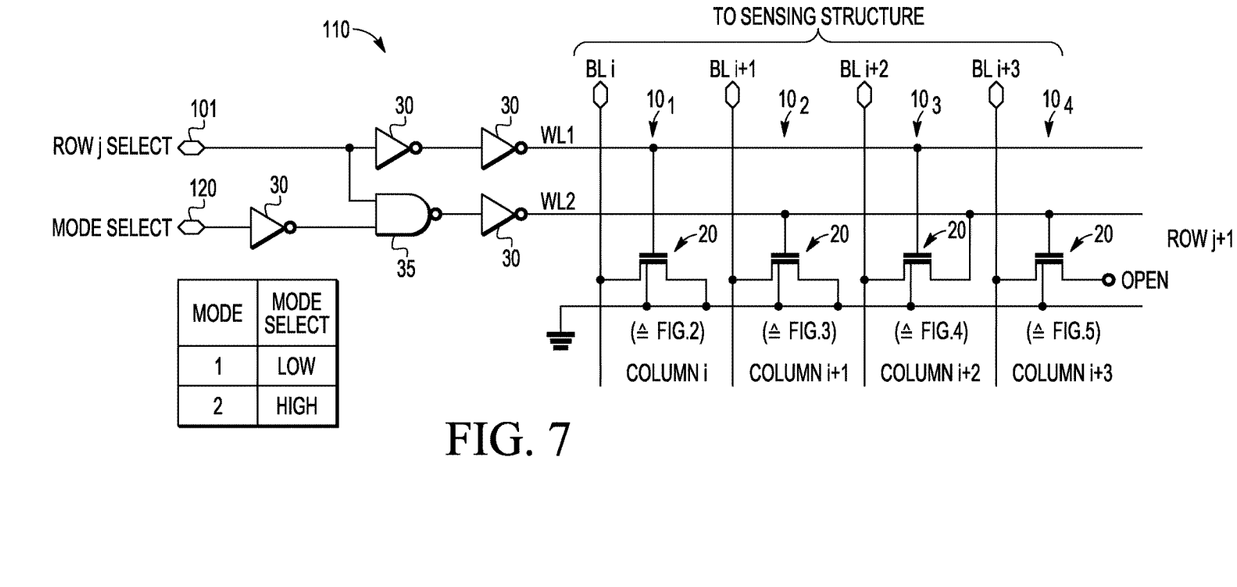
FIG. 7 schematically illustrates a circuit diagram of an example memory array with four 2-bit read only memory cells according to one embodiment of the present invention.

FIG. 7 schematically illustrates a further example memory array 100 with four read only memory cells 10 according to one embodiment of the present invention. Each of the memory cells 10 of the memory array 100 of FIG. 7 stores another one of the four different states of the 2-bit value stored in each one of the memory cells 10.

The memory array of FIG. 7 provides two word lines WL 1 and WL 2 for each Row j and one bit line BL i for each column i. For simplification, the illustrated memory array comprises one Row j and four columns i to i+3.

For instance in order to read out the memory cell $10_1$, a high voltage is applied to the Row j select terminal 101 and a pre-charging voltage is applied to the bit line BL i. The Row j select terminal is coupled to the first word line WL 1.

The first ROM mode or the second ROM mode may be selected through a mode select terminal 120, at which a mode select signal is applicable, in response to which the second word line WL 2 of the selected Row j is either driven to high or low voltage.

As illustrated in the example of FIG. 7, a logic gate 35 may couple the first word line WL 1 and the second word line WL 2 of the Row j. A logic gate 35 coupling the first word line WL 1 and the second word line WL 2 of the Row j ensures that only the second word line WL 2 of the activated Row j is switched accordingly by the mode select signal applied to the single mode select terminal for switching the mode of all memory cells of the memory array 100. In particular, the logic gate 35 may be a NAND gate. Inverters 30 may be intercoupled between Row j select terminal and the first word line WL 1 of the Row j. Further inverters may be arranged between the mode select terminal and the logic gate 35 of the Row j as well as between the logic gate 35 of the Row j and the second word line WL 2 of the Row j.

In the example of FIG. 7, the first ROM mode is switched in that a low voltage mode select signal is applied to the mode select terminal 120. In response to the low voltage signal, the second word line WL 2 of the Row j is conductively coupled to the first word line WL 1 of the Row j, to which the high voltage signal supplied to the Row j select terminal 101 is applied. Accordingly, both the first and second word lines WL 1 and WL 2 of the Row j are at high voltage level. As a result thereof, the pre-charged bit line BL i is pulled down to ground.

In the example of FIG. 7, the second ROM mode is switched in that a high voltage mode select signal is applied to the mode select terminal 120. In response to the high voltage signal, the second word line WL 2 of the Row j is conductively decoupled from the first word line WL 1 of the Row j. Hence, the second word line WL 2 of the Row j remains at a low voltage (e.g. at ground). Accordingly, only the first word line WL 1 of the Row j is at high voltage level. As a result thereof, the pre-charged bit line BL i is pulled down to ground.

Hence, the memory cell $10_1$ stores the two bit value (0, 0) as a function of the first and second ROM mode provided that a low voltage on the bit line BL represents a logic "0" (logic low) and a low voltage on the bit line represents a logic "0" (logic low).

For instance in order to read out the memory cell $10_2$, a high voltage is applied to the Row j select terminal 101 and a pre-charging voltage is applied to the bit line BL i+1. In response to the memory array 100 switched into the first ROM mode, the pre-charged bit line BL i+1 is pulled down to ground. In response to the memory array 110 switched into the second ROM mode, the pre-charged bit line BL i+1 is remains at high voltage level. Hence, the memory cell $10_2$ stores the two bit value (0, 1) as a function of the first and second ROM mode provided that a low voltage on the bit line BL represents a logic "0" (logic low) and a high voltage on the bit line BL represents a logic "1" (logic high).

For instance in order to read out the memory cell $10_3$, a high voltage is applied to the Row j select terminal 101 and a pre-charging voltage is applied to the bit line BL i+2. In response to the memory array 100 switched into the first ROM mode, the pre-charged bit line BL i+2 remains at high voltage level. In response to the memory array 110 switched into the second ROM mode, the pre-charged bit line BL i+2 is pulled down to ground. Hence, the memory cell $10_3$ stores the two bit value (1, 0) as a function of the first and second ROM mode provided that a low voltage on the bit line BL represents a logic "0" (logic low) and a high voltage on the bit line BL represents a logic "1" (logic high).

For instance in order to read out the memory cell $10_4$, a high voltage is applied to the Row j select terminal 101 and a pre-charging voltage is applied to the bit line BL i+3. In response to the memory array 100 switched into the first ROM mode, the pre-charged bit line BL i+3 remains at high voltage level. In response to the memory array 110 switched into the second ROM mode, the pre-charged bit line BL i+3 also remains at high voltage level. Hence, the memory cell $10_3$ stores the two bit value (1, 1) as a function of the first and second ROM mode provided that a high voltage on the bit line BL represents a logic "1" (logic high) and a high voltage on the bit line BL represents a logic "1" (logic high).

Summarizing the above description, reading out the Row j of the exemplary memory array 100 shown in FIG. 7 in the first ROM mode results in a signal sequence (low, low, high, high) at the bit lines BL i to BL i+3 which represents a logic combination (0, 0, 1, 1). Reading out the Row j of the exemplary memory array 100 shown in FIG. 7 in the second ROM mode results in a signal sequence (low, high, low, high) at the bit lines BL i to BL i+3 which represents a logic combination (0, 1, 0, 1). Again it is assumed that a low voltage on the bit line BL represents a logic "0" (logic low) and a high voltage on the bit line BL represents a logic "1" (logic high).

$$\text{ROM ARRAY ROW } j \begin{pmatrix} \text{first mode} \\ \text{second mode} \end{pmatrix} = \begin{pmatrix} 0 & 0 & 1 & 1 \\ 0 & 1 & 0 & 1 \end{pmatrix}$$

Those skilled in that art will understand on the basis of the above description that any possible logic combinations in the first mode or the second mode may be programmable in that the MOS transistors are coupled selectively according to the writing examples of FIGS. 2 to 5.

In the above description, the invention has been carried out with respect to a MOS transistor 20, which is selectively coupled to at least two word lines for implementing read only memory cells storing two independent logic states, which are for instance representative of a 2-bit value. The independent logic states are readable from the read only memory cells in that the MOS transistor 20 is operated in two different states on the basis of the at least two word lines. Those skilled in that art will understand on the basis of the foregoing description that the MOS transistor 20 is only one non-limiting embodiment of a combinatory logic having two independent logic states, each of which in one of two modes of operation.

Figure 8:
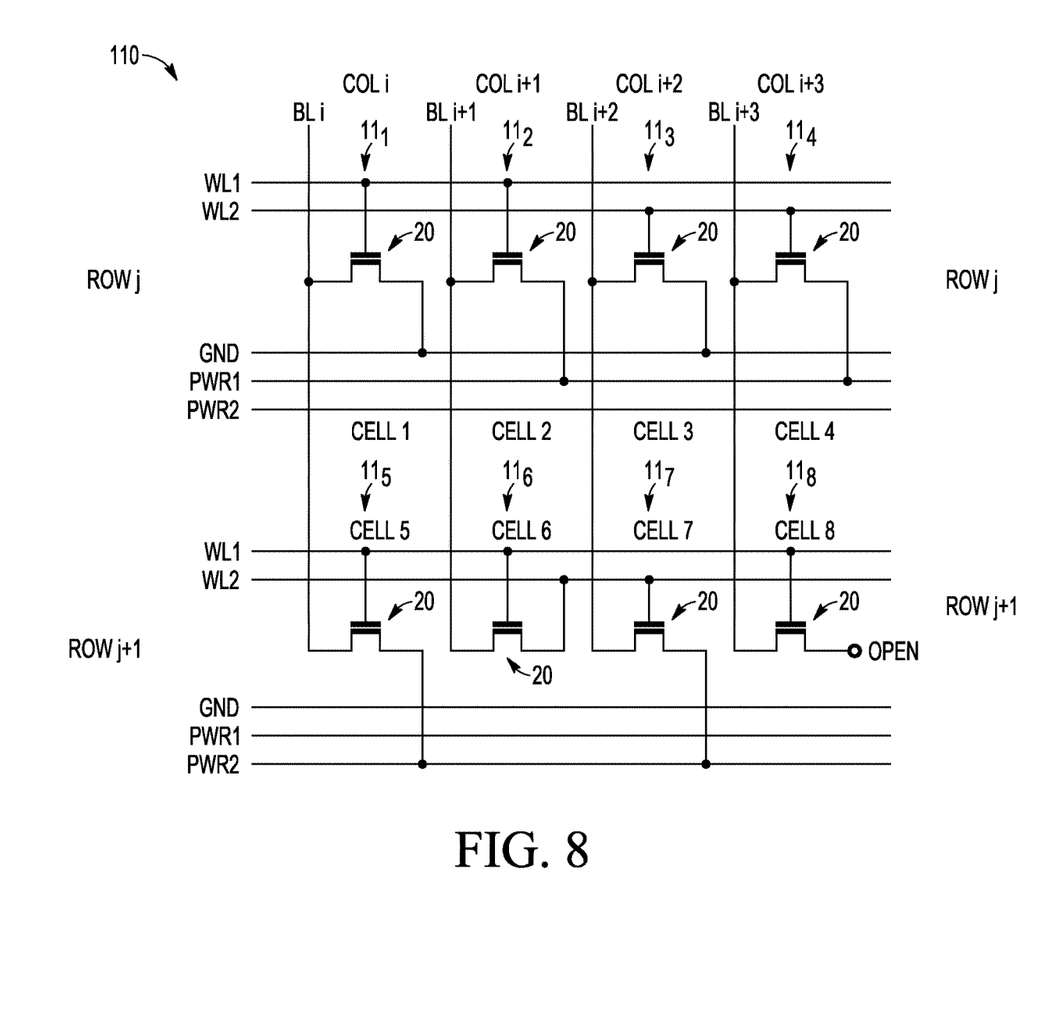
FIG. 8 schematically illustrates a circuit diagram of an example memory array with eight 3-bit read only memory cells, i.e. three logic states or bits stored therein, according to one embodiment of the present invention.

FIG. 8 schematically illustrates another example memory array 110 with eight read only memory cells 11 according to another embodiment of the present invention. Each of the eight memory cells 11 of the memory array 110 is capable of storing/representing three logic states (or three bits to be stored in each memory cell 11), which are independent from each other. Each logic state is in turn either logic high (logic "1") or logic low (logic "0"). For simplification purposes, each of the illustrated eight read only memory cell 11 stores a different 3-bit value. However, as would be understood by a person of skill in the art based on the teachings herein, example memory array may include any number of rows/columns, depending on the use requirements of the array.

Each memory cell 11 comprises a transistor 20, in particular a MOS (metal oxide semiconductor) transistor and more particularly a MOSFET (metal oxide semiconductor field effect transistor). The memory cells 11 of FIG. 8 are coupled to one of respective the bit line BL i and selectively coupled one of two word lines WL 1 and WL 2 of the respective Row j and further selectively coupled to one of ground and two switchable power lines PWR 1 and PWR 2 of the respective Row j. The word lines WL 1 and WL 2 of each Row j and the two power lines PWR 1 and PWR 2 of each Row j are provided by the memory array 110.

The memory cells $11_1$ to $11_4$ are exemplarily arranged in the Row j and the memory cells $11_5$ to $11_8$ are exemplarily arranged in the Row j+1.

The gate terminal of the MOS transistor 20 of the memory cell $11_1$ is coupled to the first word line WL 1 of the Row j, the drain terminal thereof is coupled to the bit line BL i of the column i, and the source terminal thereof is coupled to the ground.

The gate terminal of the MOS transistor 20 of the memory cell $11_2$ is coupled to the first word line WL 1 of the Row j, the drain terminal thereof is coupled to the bit line BL i+1 of the column i+1, and the source terminal thereof is coupled to the first power line PWR 1 of the Row j.

The gate terminal of the MOS transistor 20 of the memory cell $11_3$ is coupled to the second word line WL 2 of the Row j, the drain terminal thereof is coupled to the bit line BL i+2 of the column i+2, and the source terminal thereof is coupled to the ground.

The gate terminal of the MOS transistor 20 of the memory cell $11_4$ is coupled to the second word line WL 2 of the Row j, the drain terminal thereof is coupled to the bit line BL i+3 of the column i+3, and the source terminal thereof is coupled to the first power line PWR 1 of the Row j.

The gate terminal of the MOS transistor 20 of the memory cell $11_5$ is coupled to the first word line WL 1 of the Row j+1, the drain terminal thereof is coupled to the bit line BL i of the column i, and the source terminal thereof is coupled to the second power line PWR 2 of the Row j+1.

The gate terminal of the MOS transistor 20 of the memory cell $11_6$ is coupled to the first word line WL 1 of the Row j+1, the drain terminal thereof is coupled to the bit line BL i+1 of the column i+1, and the source terminal thereof is coupled to the second word line WL 2 of the Row j+1.

The gate terminal of the MOS transistor 20 of the memory cell $11_7$ is coupled to the second word line WL 2 of the Row j+1, the drain terminal thereof is coupled to the bit line BL i+2 of the column i+2, and the source terminal thereof is coupled to the second power line PWR 2 of the Row j+1.

The gate terminal of the MOS transistor 20 of the memory cell $11_8$ is coupled to the first word line WL 1 of the Row j, the drain terminal thereof is coupled to the bit line BL i+3 of the column i+3, and the source terminal thereof is open.

Figure 9:
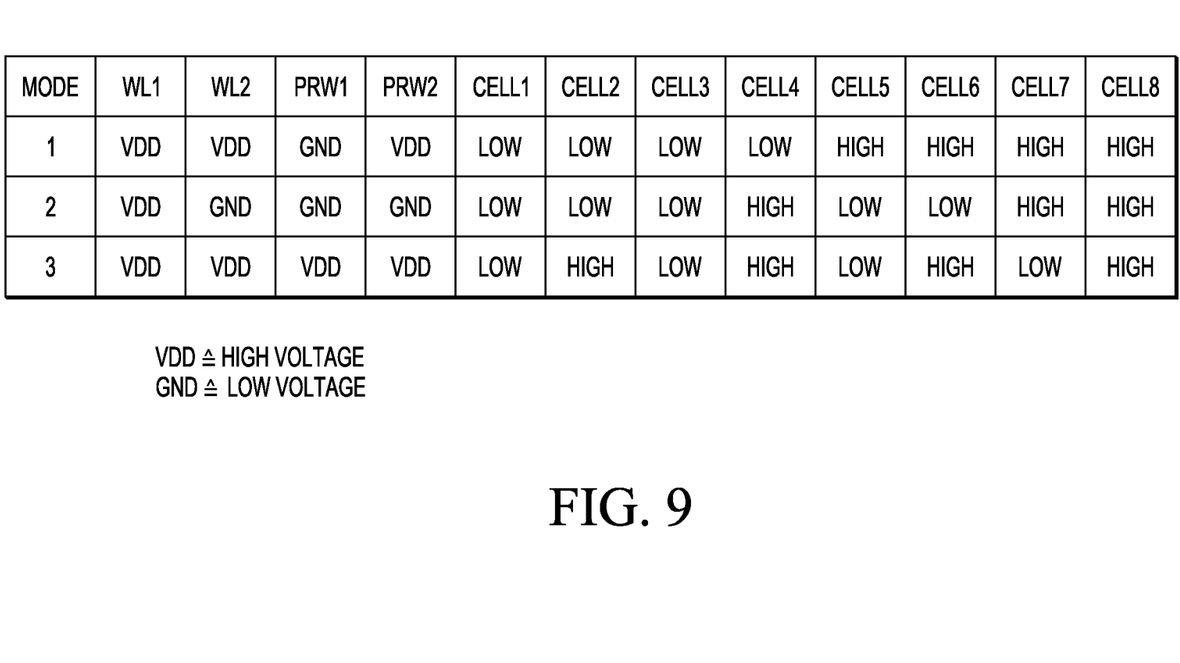
FIG. 9 shows a table of the voltage level of the (precharged) bit line BL i when reading out the 3-bit memory cells of FIG. 8 in either one of the three ROM modes.

The three states of each memory cell 11 is read out in that the respective second word line WL 2 and the respective power lines PWR 1 and PWR 2 either a high voltage level or a low voltage level is selectively applied thereto in accordance with one of three ROM modes. The ROM modes and the voltage levels to be applied to the word lines WL 1 and WL 2 and the two power lines PWR 1 and PWR 2 will be explained in more detail with reference to FIG. 9. Please consider that only one row may be activated at the same time to read out the memory cells 11 of the memory array 110 according to an embodiment of the present invention.

In order to read out the memory cells 11 in the first ROM mode, high voltage is applied to the first word line WL 1, the second word line WL 2 and the second power line PWR 2 of the respective Row. Low voltage is applied to the first power line PWR 1 of the respective Row. The respective bit line BL is pre-charged with a high voltage level. In accordance with the wiring of the MOS transistors 20 of the memory cells $11_1$ to $11_4$ (all arranged in the Row j for the sake of illustration), the bit line BL i to BL i+3 are pulled down to ground, i.e. the bit lines BL i to BL i+3 have a low voltage level. Further in accordance with the wiring of the MOS transistors 20 of the memory cells $11_5$ to $11_8$ (all arranged in the Row j+1 for the sake of illustration), the bit lines BL i to BL i+3 remain at the pre-charge voltage level, i.e. the bit lines BL i to BL i+3 have a high voltage level.

In order to read out the memory cells 11 in the second ROM mode, high voltage is only applied to the first word line WL 1 of the respective Row. Low voltage is applied to the second word line WL 2 and the two power lines PWR 1 and PWR 2 of the respective Row. The respective bit line BL is pre-charged with a high voltage level. In accordance with the wiring of the MOS transistors 20 of the memory cells $11_1$, $11_2$, $11_5$, and $11_6$, the bit line BL i and BL i+1 are pulled down to ground, i.e. the bit line BL i and BL i+1 has a low voltage level. Further in accordance with the wiring of the MOS transistors 20 of the memory cells $11_3$, $11_4$, $11_7$ and $11_8$, the bit lines BL i+2 and BL i+3 remain at the pre-charge voltage level, i.e. the bit lines BL i+2 and BL i+3 have a high voltage level.

In order to read out the memory cells 11 in the third ROM mode, high voltage is applied to the first word line WL 1, the second word line WL 2 and the first power line PWR 1 of the respective Row. Low voltage is applied to the second power line PWR 2 of the respective Row. The respective bit line BL is pre-charged with a high voltage level. In accordance with the wiring of the MOS transistors 20 of the memory cells $11_1$, $11_3$, $11_5$ and $11_7$, the bit lines BL i and BL i+2 are pulled down to ground, i.e. the bit line BL i and BL i+2 have a low voltage level. Further in accordance with the wiring of the MOS transistors 20 of the memory cells $11_2$, $11_4$, $11_6$ and $11_8$, the bit lines BL i+1 and BL i+3 remain at the pre-charge voltage level, i.e. the bit lines BL i+1 and BL i+3 have a high voltage level.

In the following, it should be assumed without limiting thereto that a low voltage on the bit line BL represents a logic "0" (logic low) and a high voltage on the bit line BL represents a logic "1" (logic high). Accordingly, the memory cell $11_1$ stores the three bit value (0, 0, 0), the memory cell $11_2$ stores the three bit value (0, 0, 1), the memory cell $11_3$ stores the three bit value (0, 1, 0), the memory cell $11_4$ stores the three bit value (0, 1, 1), the memory cell $11_5$ stores the three bit value (1, 0, 0), the memory cell $11_6$ stores the three bit value (1, 0, 1), the memory cell $11_7$ stores the three bit value (1, 1, 0), and the memory cell $11_8$ stores the three bit value (1, 1, 1) as a function of the ROM mode. The individual bit values can be subsequently read out from the memory cells $11_1$ to $11_8$ in that the ROM modes are switched accordingly as described above and shown in the table of FIG. 9.

Figure 10:
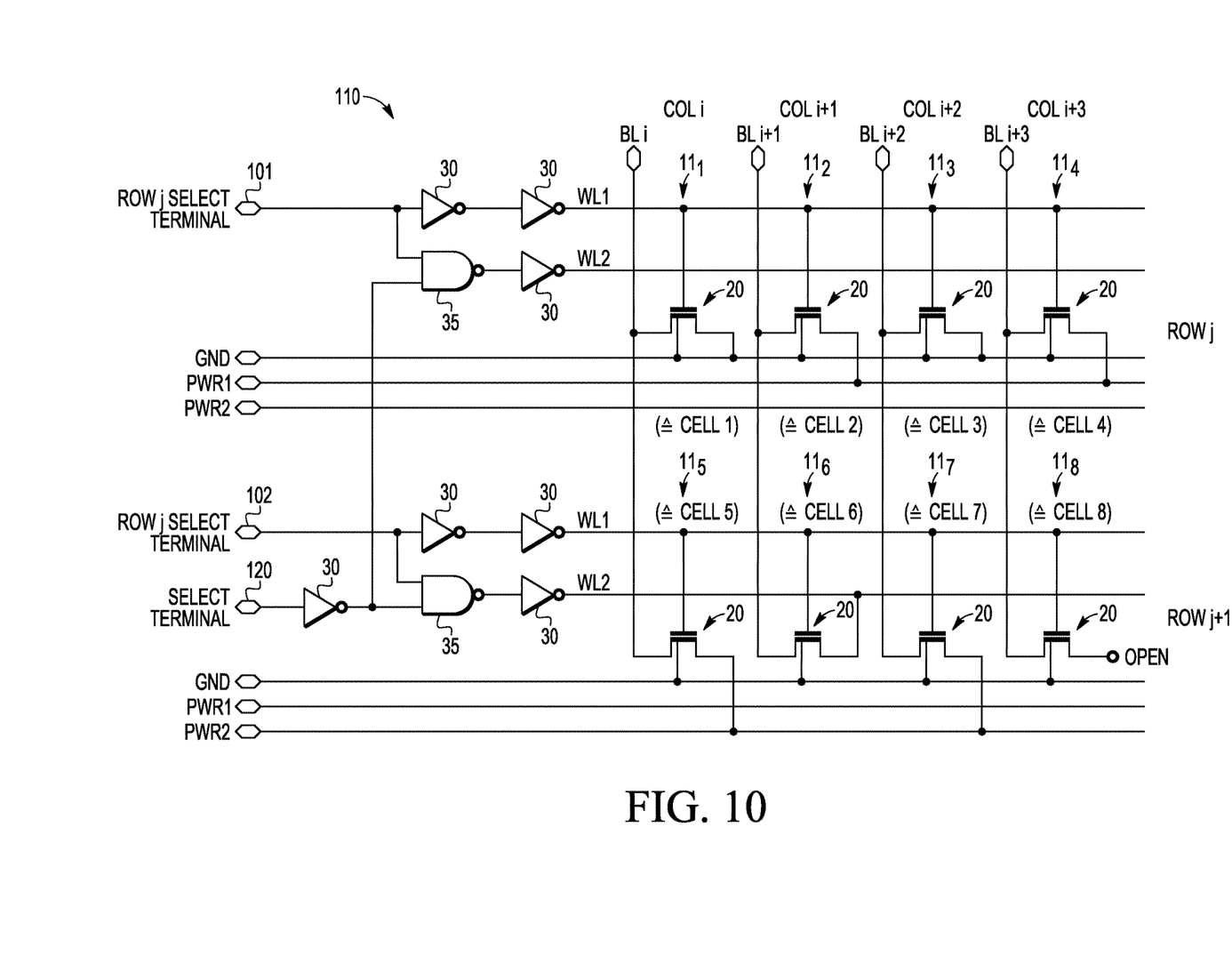
FIG. 10 schematically illustrates a circuit diagram of a further example memory array with four 3-bit read only memory cells according to one embodiment of the present invention.

FIG. 10 schematically illustrates a further example memory array 110 with eight read only memory cells 11 according to one embodiment of the present invention. Each of the memory cells 11 of the memory array 110 of FIG. 10 stores another one of the eight different states of the 3-bit value stored in each one of the memory cells 11.

The memory array of FIG. 10 provides two word lines WL 1 and WL 2 for each row and one bit line BL i for each column. For simplification, the illustrated memory array comprises two rows j and j+1 and four columns i to i+3.

Each row comprises a select terminal, the Row j select terminal 101 and the Row j+1 select terminal 102. A respective row is activatable in that a high voltage is applied to the respective select terminal 101 or 102. Moreover, each row further comprises two word lines WL 1 and WL 2, a ground line and two power lines PWR 1 and PWR 2. The first word line WL 1 of a row is coupled to the respective select terminal 101 or 102. Upon applying a high voltage to one of the select terminal, the row is activated and the first word line WL 1 is at high voltage. The voltage level of the second word line WL 2 is selectable by applying a select signal to the select terminal 120, in response to which the second word line WL 2 of the activated row is either driven to high or low voltage.

As illustrated in the example of FIG. 10, a logic gate 35 may couple the first word line WL 1 and the second word line WL 2 of each row. The state of the logic gate 35 of each row is controlled in accordance with the select signal applied to the single select terminal for controlling the voltage level of the second word line WL 2 of the activated row. In particular, the logic gates 35 may be NAND gates. Inverters 30 may be intercoupled between Row j and Row j+1 select terminals 101, 102 and the first word line WL 1 of the respective Row j and Row j+1. Further inverters may be arranged between the select terminal 120 and the logic gates 35 of the Row j and Row j+1 as well as between the logic gate 35 and the second word line WL 2 of the respective Row j and Row j+1.

In the example of FIG. 10, the first ROM mode is switched in that a low voltage select signal is applied to the select terminal 120 and a high voltage is applied to the second power line PWR 2 of the activated Row j or Row j+1. A low voltage is applied to the first power line PWR 1 of the activated Row j or Row j+1, e.g. the first power line PWR 1 of the activated row is coupled to ground. In response to the low voltage signal at the select terminal 120, the second word line WL 2 of the activated Row j or Row j+1 is conductively coupled to the first word line WL 1 of the activated row. Accordingly, the second word line WL 2 of the activated row is also driven to high voltage.

The second ROM mode is switched in that a high voltage select signal is applied to the select terminal 120. A low voltage is applied to the two power lines PWR 1 and PWR 2 of the activated Row j or Row j+1, e.g. the two power lines PWR 1 and PWR 2 of the activated row are coupled to ground. In response to the high voltage signal at the select terminal 120, the second word line WL 2 of the activated Row j or Row j+1 is conductively decoupled from the first word line WL 1 of the activated row. Accordingly, the second word line WL 2 of the activated row is driven to low voltage.

The third ROM mode is switched in that a low voltage select signal is applied to the select terminal 120 and a high voltage is applied to the first power line PWR 1 of the activated Row j or Row j+1. A low voltage is applied to the second power line PWR 2 of the activated Row j or Row j+1, e.g. the second power line PWR 2 of the activated row is coupled to ground. In response to the low voltage signal at the select terminal 120, the second word line WL 2 of the activated Row j or Row j+1 is conductively coupled to the first word line WL 1 of the activated row. Accordingly, the second word line WL 2 of the activated row is also driven to high voltage.

A control circuit (not shown) may be provided, which supplies the high or low voltage signals to the mode select terminal 120 and the two power lines PWR 1 and PWR 2 of the activated row in accordance with the ROM mode.

A voltage sensing structure (not shown) may be arranged with the bit lines BL i to BL i+3. The voltage sensing structure is for instance configured to sense the high voltage state or low voltage state of the bit lines BL i to BL i+1.

Summarizing the above description, reading out the Row j of the exemplary memory array 110 shown in FIG. 10 in the first ROM mode results in a signal sequence (low, low, low, low) at the bit lines BL i, to BL i+3, which represents a logic combination (0, 0, 0, 0). Reading out the Row j of the exemplary memory array 110 shown in FIG. 10 in the second ROM mode results in a signal sequence (low, low, high, high) at the bit lines BL i to BL i+3, which represents a logic combination (0, 0, 1, 1). Reading out the Row j of the exemplary memory array 110 shown in FIG. 10 in the third ROM mode results in a signal sequence (low, high, low, high) at the bit lines BL i to BL i+3, which represents a logic combination (0, 1, 0, 1).

Reading out the Row j+1 of the exemplary memory array 110 shown in FIG. 10 in the first ROM mode results in a signal sequence (high, high, high, high) at the bit lines BL i, to BL i+3, which represents a logic combination (1, 1, 1, 1). Reading out the Row j+1 of the exemplary memory array 110 shown in FIG. 10 in the second ROM mode results in a signal sequence (low, low, high, high) at the bit lines BL i to BL i+3, which represents a logic combination (0, 0, 1, 1). Reading out the Row j+1 of the exemplary memory array 110 shown in FIG. 10 in the third ROM mode results in a signal sequence (low, high, low, high) at the bit lines BL i to BL i+3, which represents a logic combination (0, 1, 0, 1).

Again it is assumed that a low voltage on the bit line BL represents a logic "0" (logic low) and a high voltage on the bit line BL represents a logic "1" (logic high).

$$\text{ROM ARRAY ROW } j \begin{pmatrix} \text{first mode} \\ \text{second mode} \\ \text{third mode} \end{pmatrix} = \begin{pmatrix} 0 & 0 & 0 & 0 \\ 0 & 0 & 1 & 1 \\ 0 & 1 & 0 & 1 \end{pmatrix}$$

$$\text{ROM ARRAY ROW } j+1 \begin{pmatrix} \text{first mode} \\ \text{second mode} \\ \text{third mode} \end{pmatrix} = \begin{pmatrix} 1 & 1 & 1 & 1 \\ 0 & 0 & 1 & 1 \\ 0 & 1 & 0 & 1 \end{pmatrix}$$

Those skilled in that art will understand on the basis of the above description that any possible logic combinations in the first mode or the second mode may be programmable in that the MOS transistors are coupled selectively according to the writing examples of FIG. 8 with respect to the memory cells $11_1$ to $11_8$.

In the above description, the invention has been carried out with respect to a MOS transistor 20, which is selectively coupled to at least two word lines and two power lines for implementing read only memory cells storing three independent logic states, which are for instance representative of a 3-bit value. The independent logic states are readable from the read only memory cells in that the MOS transistor 20 is operated in three different states on the basis of the at least two word lines and two power lines. Those skilled in that art will understand on the basis of the foregoing description that the MOS transistor 20 is only one non-limiting embodiment of a combinatory logic having three independent logic states, each of which in one of three modes of operation.

Figure 11:
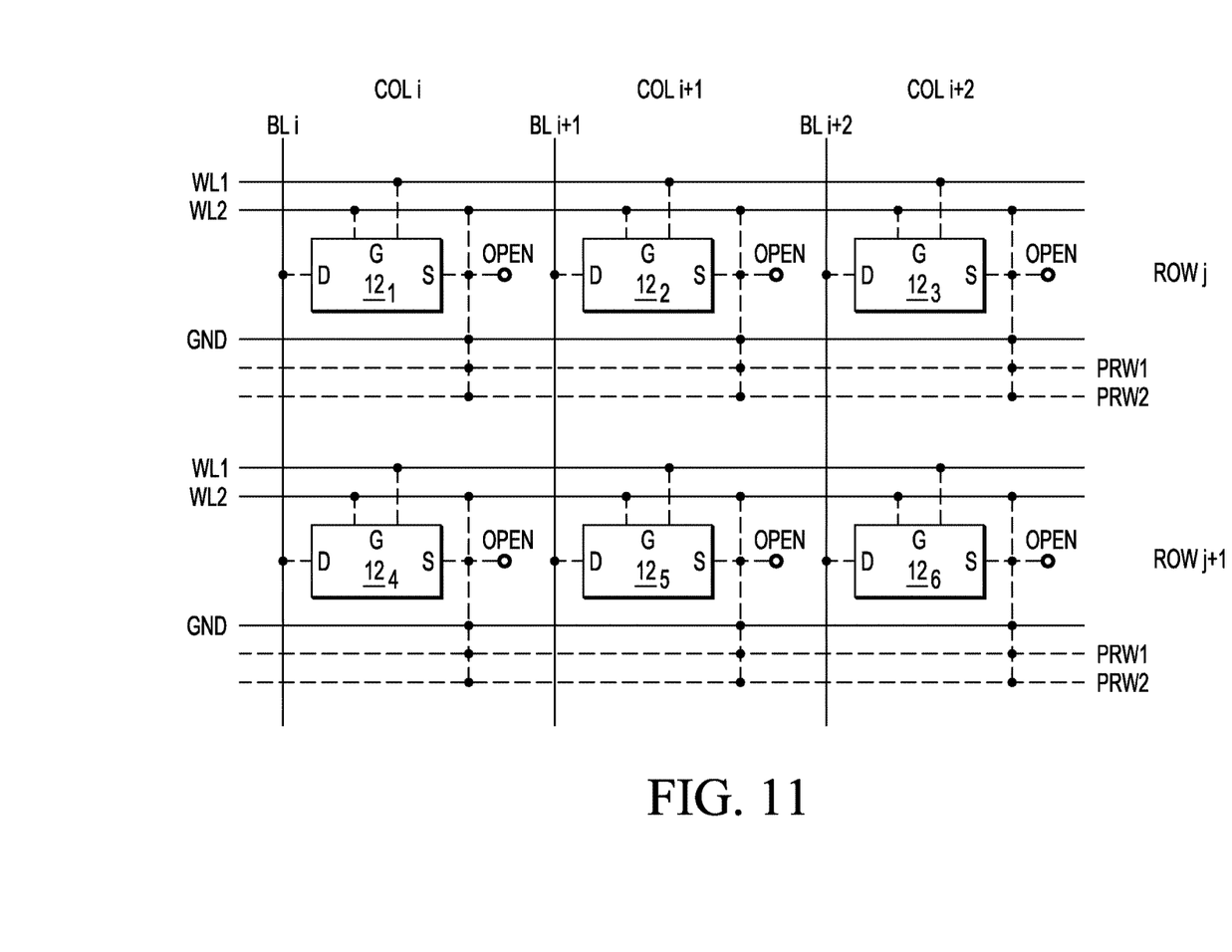
FIG. 11 schematically illustrates a circuit diagram of yet a further example memory array with read only memory cells according to one embodiment of the present invention.

Referring now to FIG. 11, a read only memory (ROM) array according to yet a further embodiment of the present invention is illustratively shown. The ROM array comprises at least a first row with a plurality of read only memory cells. For the sake of illustrating but not limiting thereto the exemplarily illustrated ROM array comprises two rows, e.g. the Row j and Row j+1, each of which having three memory cells, e.g. the memory cells $12_1$, $12_2$, and $12_3$ in Row j and the memory cells $12_4$, $12_5$, and $12_6$ in Row j+1.

A first conductive line WL 1 and second conductive line WL 2 is arranged with each row of the ROM array. The first and second conductive lines WL 1, WL 2 are also designated above as first and second word lines. The first conductive line WL 1 serves to active the memory cells of the respective row and the second conductive line WL 2 servers to active and switch selectively between a first mode and a second mode.

The conductive lines WL 1 and WL 2 may be also understood as activation and control lines.

The memory cells 12 of one row are selectively coupled to the first conductive line WL 1 and the second conductive line WL 2 the respective one row during programming of the memory cells 12. As a result thereof, the memory cells 12 of one row provide a first combination of logic highs and logic lows in the first mode of the ROM array and the memory cells 12 of the one row provide a second combination of logic highs and lows in a second mode of the memory independent of the first combination of logic highs and logic lows. In the embodiment shown in FIG. 11, the first combination of logic highs and logic lows as well as the second combination of logic highs and lows may be read out through the bit lines BL i, BL i+1, and BL i+2.

The memory cells 12 may be further selectively coupled to a ground line GND of the respective row during programming. In particular, the memory cells 12 are selectively configured to be in one of four possible configurations. The logic signals outputted by the memory cells 12 differ from each other in the four possible configurations. Each of the four possible configurations may result in providing one of a group consisting of a logic high and a logic low.

In particular, each memory cell 12 of the ROM array has a gate (terminal) G and a source (terminal) S. The four possible configurations may comprise:

the gate G connected to the first conductive line WL 1 and the source S connected to a ground line GND (cp. also the embodiment of FIG. 2);

the gate G connected to the second conductive line WL 2 and the source S connected to the ground line GND (cp. also the embodiment of FIG. 3);

the gate G connected to the first conductive line WL 1 and the source S connected to the second conductive line WL 2 (cp. also the embodiment of FIG. 4);

the gate G connected to the second conductive line WL 2 and the source left open (cp. also the embodiment of FIG. 5)

The first mode is active in the memory cells 12 of one row of ROM array when the first conductive line WL 1 of the respective row is enabled or activated (e.g. a high voltage is applied) and the second line is disabled or deactivated (e.g. a low voltage is applied or is coupled to ground). The second mode is active in the memory cells 12 of one row of ROM array when the first conductive line WL 1 is enabled or active and the second conductive line is active.

The ROM array may further provide a third conductive line PWR 1 along each row of the memory cells 12 and a fourth conductive line PWR 2 along each row of memory cells 12. The memory cells 12 of each row of or the ROM array may further selectively coupled during programming to the third conductive line PWR 1 and the fourth conductive line PWR 2. As a result thereof, the memory cells 12 of one row of the ROM array provide a third combination of logic highs and logic lows in a third mode, wherein the third combination is independent of the first and second combinations of logic highs and logic lows.

The third and fourth conductive lines PWR 1 and PWR 2 are also designed above as power lines PWR 1 and PWR 2 and may be further understood as reference signal lines.

In particular, each of the memory cells 12 may be in any one of eight possible configurations with respect to the first, second and third mode. Each configuration is read as one of a logic high and a logic low and differs from each other with respect to the first, second and third modes.

Figure 12:
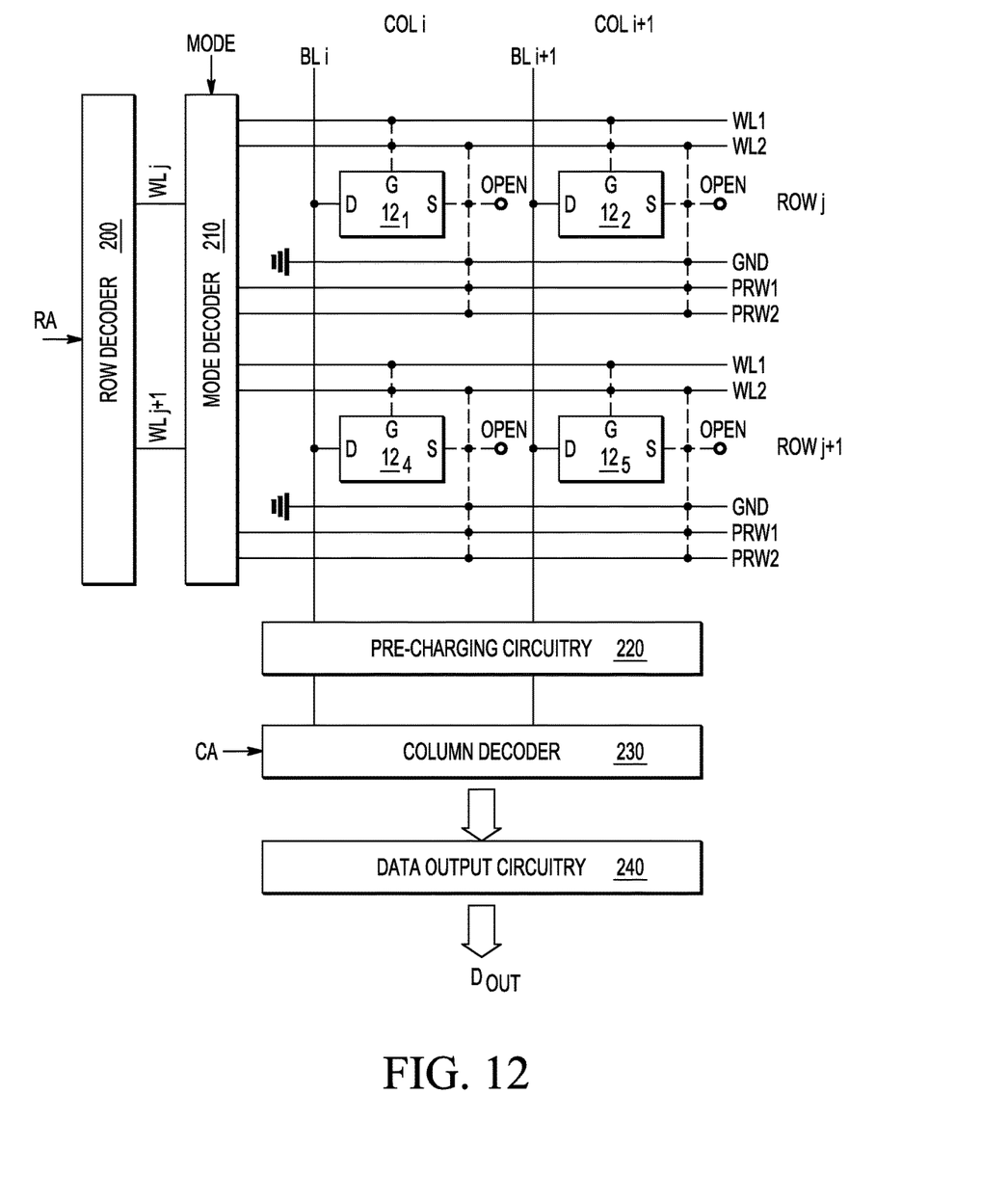
FIG. 12 schematically illustrates a further block diagram of the example memory array of FIG. 11.

FIG. 12 illustrates a further block diagram of a ROM device including the ROM array described above with reference to FIG. 11. Referring now to FIG. 12, the ROM device includes the array of memory cells $12_1$ to $12_5$, a row decoder 200, a mode decoder 210, a pre-charge circuitry 220, a data transmission gate (not shown), a column decoder 230, and a data output circuitry 240. The ROM device also includes a plurality of bit lines BL i, BL i+1 corresponding to the columns i, i+1 and a plurality of word lines WL j, WL j+1 corresponding to the Rows j, j+1.

The memory cell array includes a plurality of memory cells $12_1$ to $12_5$, each cell having a gate (G) selectively connected to one of a word line WL 1 and word line WL 2 of the respective row, a source (S) selectively connected to one of a ground voltage line GND, one of the power lines PRW 1, PWR 2 and an open terminal and a drain (D) connected a respective one of the bit lines BL i, BL i+1.

The row decoder 200 decodes a row address RA and selects one of the word lines WL j, WL j+1. The mode decoder 210 receives the mode signal and selectively switches the word lines WL 1, WL 2 and power lines PRW 1, PWR 2 of the selected row j in response to the word line WL j selected by the row decoder 200 and further in response to the received mode signal. The pre-charge circuitry 220 allows for pre-charging the bit lines BL i, BL i+1 to a logic high. The data transmission gate transfers data from the bit lines BL i, BL i+1 to the data output circuitry 240, in response to respective column selection signals. The column decoder 230 decodes a column address CA and selects a column selection signal of the column selection signals. The data output circuitry 240 receives the data from the data transmission gate and outputs an output data Dout.

During a read operation, the pre-charge circuit 14 pre-charges the bit lines BL i, BL i+1 to a logic high. A word line WL j is selected based on the row address RA. The row specific word lines WL 1 and WL 2 and power lines PWR 1 and PWR 2 of the selected Row j are selectively powered or connected to ground. If a pre-charged bit line BL i, BL i+1 is connected to ground through the memory cells of the Row j, current flows from the bit lines BL i, BL i+1 to the ground. As a result, the bit lines BL i, BL i+1 have a logic low. If a bit line BL i, BL i+1 is connected to a powered line or to an open terminal, charges are not drawn to the ground, so that the bit line BL i, BL i+1 maintains a logic high. If a column selection signal is generated, the logic level of one of the bit lines BL i, BL i+1 is output from the data transmission gate to data output circuitry 240 in response to the column selection signal generated by the column decoder 230 on the basis of the column address CA. The data output circuitry 240 provides the logic level of a memory cell identified by the row address RA and the column address CA.

Figure 13:
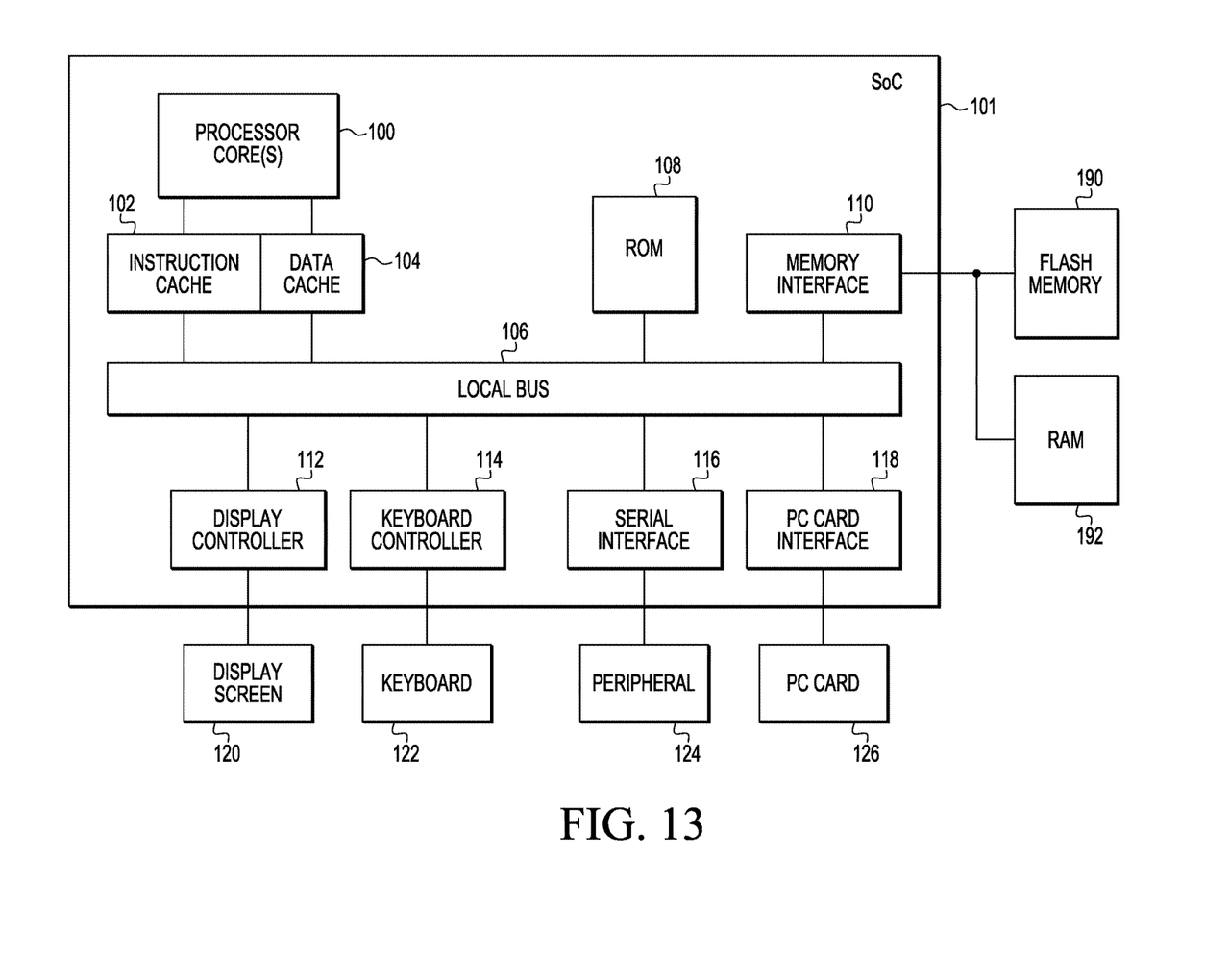
FIG. 13 schematically illustrates a block diagram of an exemplary system-on-chip (SoC) according to one embodiment of the present invention.

FIG. 13 illustrates an exemplary SoC 101 according to an embodiment of the present application. The SoC 101 comprises one or more processor cores 100, each of which is coupled to or comprise an instruction cache 102 and a data cache 104. The instruction cache 102 and the data cache 104 are coupled to a local bus 106. The local bus may comprise at least one of a common bus, a point to point-interconnect, a switchable fabric, a coherency fabric and the like. The SoC 101 also comprises various other hardware components that would be specific to a particular application. Examples of such typical hardware components are a display controller 112, a keyboard controller 114, a serial interface (such as a USB) 116 and detachable card interface (such a PCIe) 118. These components are coupled to local bus 106. These hardware components may be also coupled to devices that are external to the SoC 101. In this example, the display controller 112 is coupled to a display screen 120, the keyboard controller 114 is coupled to the keyboard 122, the serial I/F 116 is coupled to a peripheral device 124, and the card interface 118 is coupled to an extension card 126.

Memory interface 110 is provided on the exemplary SoC 101 to act as an interface between e.g. a flash memory 190 and a Random Access Memory (RAM) 192 and the local bus 206. Data and instructions executable by one or more processor cores 100 can be stored in flash memory 190 and SRAM 192.

In certain applications, where e.g. proprietary, confidential and/or safety relevant information are used, it is often advantageous to also include ROM on-board the SoC. Because ROM resides on the SoC and is programmed in manufacturing, unauthorized access to the information content within the ROM is made more difficult. This allows greater security against reverse engineering and unauthorized modifications of the information content. The exemplary SoC 101 further comprises ROM 108, which is coupled to local bus 106 and which can be programmed with data and instructions executable by one or more processor cores 100.

In the foregoing specification, the invention has been described with reference to specific examples of embodiments of the invention. It will be evident, however, that various modifications and changes may be made therein without departing from the broader spirit and scope of the invention as set forth in the appended claims.

The word "exemplary" is used herein to mean "serving as an example, instance, or illustration". Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The word "comprising" does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to distinguish arbitrarily between the elements such terms describe. Thus, these terms are not necessarily intended to indicate temporal or other prioritization of such elements. The mere fact that certain measures are recited in mutually different claims does not indicate that a combination of these measures cannot be used to advantage. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

What is claimed is:

1. A method for a read only memory (ROM) having a first row of ROM cells comprising:
   programming the first row of ROM cells;
   based on a mode select signal, selecting a first mode of the ROM and a second mode of the ROM;
   in the first mode of the ROM, reading the first row of ROM cells as a first combination of logic highs and logic lows;
   in the second mode of the ROM, reading the first row of ROM cells as a second combination of logic highs and logic lows;
   in the first mode of the ROM and a second row of ROM cells being selected for reading, deselecting the first row of ROM cells and reading the second row of ROM cells as a third combination of logic highs and logic lows; and
   in the second mode of the ROM and the second row of ROM cell being selected for reading, deselecting the first row of ROM cells and reading the second row of ROM cells as a fourth combination of logic highs and logic lows, wherein the third and fourth combinations are independent;
   wherein:
   the first row of ROM cells were programmed to be readable as the first combination in the first mode and readable as the second combination in the second mode by the programming; and
   the first combination is independent of the second combination.

2. The method of claim 1, wherein the first row of ROM cells comprises a first conductive line and a second conductive line, further comprising entering the first mode by enabling a first combination of the first conductive line and the second conductive line and entering the second mode by enabling a second combination of the first conductive line and the second conductive line.

3. The method of claim 2, wherein the ROM has a plurality bit lines orthogonal to the first row coupled to the first row of ROM cells, and the first and second combinations of logic highs and logic lows are readable on the plurality of bit lines.

4. The method of claim 3, further comprising:
   based on the mode select signal, selecting a third mode of the ROM;
   in the third mode of the ROM, reading the first row of ROM cells as a third combination of logic highs and logic lows independent of the first and second combinations.

5. The method of claim 4, wherein the first row of ROM cells further comprises a third conductive line, a fourth conductive line, and a ground line; each ROM cell of the first row of ROM cells has a gate and a source; and the programming connects the gates to selected ones of the first and second conductive lines and the sources to selected ones of the second conductive line, the third conductive line, the fourth conductive line, and the ground line.

6. The method of claim 2, wherein the programming the first row of ROM cells includes programming a first ROM cell having a gate and a source of the first row of ROM cells by one of a group consisting of:
   connecting the gate to the first conductive line and connecting the source to a ground line;
   connecting the gate to the second conductive line and connecting the source to the ground line;
   connecting the gate to the first conductive line and connecting the source to the second conductive line; and
   connecting the gate to the second conductive line and leaving the source open.

7. The method of claim 6, wherein:
   the reading the first row of ROM cells as the first combination of logic highs and logic lows comprises coupling a row select signal to the first conductive line and disabling the second conductive line; and
   the reading the first row of ROM cells as the second combination of logic highs and logic lows comprises coupling the row select signal to the first conductive line and coupling the row select signal to the second conductive line.

8. A read only memory (ROM) comprising:
   a first row of ROM cells;
   a second row of ROM cells;
   a first conductive line along the first row of ROM cells;
   a second conductive line along the first row of ROM cells;
   a mode selection circuit, the mode selection circuit selecting a first mode of the ROM and a second mode of the ROM based on a mode select signal;
   wherein the ROM cells of the first row of ROM cells are coupled during programming to the first conductive line and the second conductive line so that in the first mode of the ROM the first row of ROM cells provide a first combination of logic highs and logic lows and in the second mode of the ROM the first row of ROM cells provide a second combination of logic highs and lows independent of the first combination of logic highs and logic lows; and
   wherein the second row of ROM cells has a third combination of logic highs and logic lows for the first mode, the third combination independent of the first and second combinations; and
   wherein the second row of ROM cells has a fourth combination of logic highs and logic lows for the second mode, the fourth combination independent of the first, second, and third combinations.

9. The ROM of claim 8, wherein the ROM cells are configured to be in one of four possible configurations.

10. The ROM of claim 9, wherein each of the four possible configurations results in providing one of a group consisting of a logic high and a logic low.

11. The ROM of claim 10, wherein each ROM cell of the ROM cells has a gate and a source and the four possible configurations comprise:
    the gate connected to the first conductive line and the source connected to a ground line;
    the gate connected to the second conductive line and the source connected to the ground line;
    the gate connected to the first conductive line and the source connected to the second conductive line; and
    the gate connected to the second conductive line and the source left open.

12. The ROM of claim 11, wherein the first mode is active in the first row of ROM cells when the first conductive line is enabled and the second line is disabled, and the second mode is active in the row of ROM cells when the first conductive line is active and the second conductive line is active.

13. The ROM of claim 8, further comprising:
    a third conductive line along the first row of ROM cells;
    a fourth conductive line along the first row of ROM cells;
    wherein the mode selection circuit, selects a third mode of the ROM based on the mode select signal;
    wherein the ROM cells of the first row of ROM cells are further characterized as being coupled during programming to the third conductive line and the fourth conductive line so that in the third mode of the ROM the first row of ROM cells provide a third combination of logic highs and logic lows independent of the first and second combinations of logic highs and logic lows.

14. The ROM of claim 13, wherein each of the ROM cells may be in any one of 8 possible configurations, each configuration being read as one of a logic high and a logic low.

15. The ROM of claim 13, the second row of ROM cells has a fifth combination of logic highs and logic lows for the third mode of the ROM, the fifth combination independent of the first, second, third, and fourth combinations.

16. A read only memory (ROM) cell structure, comprising:
   a bit line;
   a first conductive line;
   a second conductive line;
   a third conductive line;
   a fourth conductive line;
   a mode selection circuit, the mode selection circuit selecting a first mode of the ROM, a second mode of the ROM, and a third mode of the ROM based on a mode select signal;
   a transistor having a drain coupled to the bit line, a gate and a source of the transistor coupled during programming to the first conductive line, the second conductive line, and a ground line to result in having the first mode of the ROM that provides a first predetermined one of a logic high and a logic low and the second mode of the ROM that provides a second predetermined one of a logic high and a logic low, wherein the transistor is further characterized as being coupled during programming to the third conductive line and the fourth conductive line to result in having the third mode that provides a third predetermined one of a logic high and a logic low.

17. The ROM cell structure of claim 16, wherein the gate and source of the transistor are coupled during programming in a configuration comprising one of a group consisting of:
   the gate connected to the first conductive line and the source connected to a ground line;
   the gate connected to the second conductive line and the source connected to the ground line;
   the gate connected to the first conductive line and the source connected to the second conductive line; and
   the gate connected to the second conductive line and the source left open.

* * * * *